United States Patent
Song et al.

(10) Patent No.: US 6,818,497 B2
(45) Date of Patent: Nov. 16, 2004

(54) METHOD FOR FABRICATING CAPACITOR USING ELECTROCHEMICAL DEPOSITION

(75) Inventors: Chang-Rock Song, Ichon-shi (KR); Hyung-Bok Choi, Ichon-shi (KR)

(73) Assignee: Hynix Semiconductor INC, Ichon (KR)

(*) Notice: Subject to any disclaimer, the term of this patent is extended or adjusted under 35 U.S.C. 154(b) by 57 days.

(21) Appl. No.: 10/330,125

(22) Filed: Dec. 30, 2002

(65) Prior Publication Data

US 2003/0203588 A1 Oct. 30, 2003

(30) Foreign Application Priority Data

Apr. 26, 2002 (KR) ........................................ 2002-23000

(51) Int. Cl.⁷ ............................................ H01L 21/8242
(52) U.S. Cl. ...................... 438/239; 438/254; 438/396; 438/650
(58) Field of Search ................................ 438/238–240, 438/254, 396, 650

(56) References Cited

U.S. PATENT DOCUMENTS

| | | | | |
|---|---|---|---|---|
| 5,789,320 A | * | 8/1998 | Andricacos et al. | 438/678 |
| 6,383,865 B2 | | 5/2002 | Hong et al. | |
| 6,432,794 B1 | * | 8/2002 | Lou | 438/396 |
| 6,444,479 B1 | * | 9/2002 | Choi | 438/3 |
| 6,461,913 B2 | * | 10/2002 | Hong | 438/253 |
| 6,468,874 B1 | * | 10/2002 | Yu et al. | 438/396 |
| 6,596,548 B2 | * | 7/2003 | Hong | 438/3 |
| 6,630,387 B2 | * | 10/2003 | Horii | 438/396 |
| 2002/0146850 A1 | * | 10/2002 | Choi | 438/3 |
| 2003/0119250 A1 | * | 6/2003 | Lee | 438/238 |
| 2003/0203570 A1 | * | 10/2003 | Song et al. | 438/254 |

FOREIGN PATENT DOCUMENTS

| KR | 2001-60562 | 7/2001 |
|---|---|---|
| KR | 2002-2081 | 1/2002 |

OTHER PUBLICATIONS

CRC Handbook of Chemistry and Physics, pp. 12–35 and 12–36.*

* cited by examiner

Primary Examiner—Ernest Karlsen
Assistant Examiner—Asok Kumar Sarkar
(74) Attorney, Agent, or Firm—Jacobson Holman PLLC

(57) ABSTRACT

The present invention relates to a method for fabricating a capacitor of a semiconductor memory device using an electrochemical deposition. The method in accordance with the present invention includes the steps of forming a contact hole in an insulating layer formed on a substrate; forming a plug in the contact hole, wherein the plug contains a nitride layer; forming a seed layer on the insulating layer and in the contact hole; forming a sacrificial layer including a trench overlapped with the contact hole; forming a Ru bottom electrode in the trench with electrochemical deposition; removing the sacrificial layer and exposing the Ru bottom electrode, wherein the seed layer not covered with the Ru bottom electrode is exposed; removing the exposed seed layer; forming a dielectric layer on the Ru bottom electrode; and forming a top electrode on the dielectric layer.

11 Claims, 8 Drawing Sheets

METHOD FOR FABRICATING CAPACITOR USING ELECTROCHEMICAL DEPOSITION

FIELD OF THE INVENTION

The present invention relates to a method for fabricating a semiconductor memory device; and more particularly, to a method for fabricating a capacitor of a semiconductor memory device using an electrochemical deposition.

DESCRIPTION OF THE PRIOR ART

Semiconductor memory devices are generally classified with a random access memory (RAM) and a read only memory (ROM). Specifically the RAM is classified with the a dynamic random access memory (DRAM) and a static random access memory (Static RAM). The DRAM which comprises one transistor and one capacitor in a unit cell, has an advantage in the integration. Therefore, the DRAM has the largest market share in a field of the memory devices.

Acceleration in integration scale of a semiconductor memory device has led a memory capacitance to be augmented by fourfold for every three years. This acceleration has currenty advanced a state of achieving mass production of DRAMs with 256 mega bit or one giga bit.

The area of unit cell and the capacitor should be reduced to less than 0.5 ▼$^2$ and 0.3 ▼$^2$ respectively, in case of 256M DRAM.

For this reason, the conventional techniques for the fabrication of the memory devices have limitations to be adopted to the memory device above the 256M devices. In case of fabricating a capacitor in 64M DRAM with use of the conventional dielectric material such as $SiO_2$ and $Si_3N_4$, the capacitor area should be over six times than the cell area even though the thickness of a dielectric layer in the capacitor can be reduced as thin as possible in order to obtain required capacitance.

Researches for increasing the surface area of the capacitor has been developed. A three-dimensional stack capacitor, a trench type capacitor and a hemispherical type capacitor are introduced to increase the surface area of a bottom electrode of a capacitor.

However, it is impossible to increase the capacitance by more reducing the thickness of the dielectric layer of the capacitor in a devices above 256M DRMA in case of using a material of oxide nitride oxide (ONO). Also, it is impossible to increase the capacitance by fabricating a capacitor having more complicate structure, because the cost is increased as the number of processes to fabricate the complicate capacitor structure.

A high dielectric material such as $Ta_2O_5$, $(Ba,Sr)TiO_3$, $Al_2O_3$, $SrTiO_3$ or TaON is used to form the dielectric layer of the capacitor instead of ONO having lower dielectric constant than the high dielectric material.

The dielectric constants of the high dielectric material vary in accordance with a material of the bottom electrode the capacitor. According to researches up to the present, the excellent dielectric characteristic of the dielectric layer of the capacitor can be obtained in case that the high dielectric material is deposited on a bottomed electrode formed with metal. Therefore, metal such as Pt, Ir, Rh or Ru is used to formed the bottom electrode instead of polysilicon.

A conventional method for fabricating a capacitor in a semiconductor device is described referring to FIG. 1A to FIG. 1E.

Referring to FIG. 1A, an first interlayer insulating layer 11 is formed over a semiconductor substrate 10 on which transistors (not shown) and bit lines (not shown) are already formed. The first interlayer insulating layer 11 is etched to form a contact hole exposing a portion of the semiconductor substrate 10.

Referring to FIG. 1B, a polysilicon layer is formed on the interlayer insulating layer 11 including the contact hole, and an etch back process is applied to form a polysilicon plug 12 in the contact hole. Then, a titanium layer is formed and a rapid thermal process (RTP) is performed to form a titanium silicide 13 on the polysilicon plug by inducing a reaction between silicon atoms in the polysilicon plug and the titanium layer. The titanium silicide layer 13 forms an Ohmic contact between the polysilicon plug 12 and a bottom electrode. Thereafter, a titanium nitride layer 14 is formed and removed until a surface of the first interlayer insulating layer is exposed with a chemical-mechanical polishing or an etch back. The titanium nitride layer 14 prevents diffusion of material polysilicon plug 12 and the bottom electrode for a thermal process. The titanium nitride layer 14 also prevents oxygen.

Referring to FIG. 1C, a sacrificial layer 15 is formed on a resulting structure including the first interlayer insulating layer and the titanium nitride layer 14. A trench 16 is formed in the sacrificial layer 15 through a mask formation process and an etch process.

Referring to FIG. 1D, a Ru bottom electrode 17 is formed on the sacrificial layer 15 including the trench with MOCVD deposition.

Referring to FIG. 1E, the Ru bottom electrode 17 is selectively removed in order that the Ru bottom electrode 17 is left only in the trench.

Referring to FIG. 1F, a high dielectric layer 18 and a top electrode 19 are formed to form a capacitor.

The structure of Ru bottom electrode 17 formed is coarse, because the Ru bottom electrode 17 is formed at a low temperature with the MOCVD. A RTP process is applied to the Ru bottom electrode 17 in order to densify the structure of the Ru bottom electrode 17. However, cracks are generated in the Ru bottom electrode 17 during the RTP.

Portion of titanium nitiride layer 14 are exposed by the cracks in the Ru bottom electrode 17, and a low dielectric layer is formed and oxidized during a following thermal process. Therefore, the characteristics of the capacitor are deteriorated. The above mentioned problem can be overcome with the limitation that the Ru bottom electrode 17 is formed at the low temperature for improving the step coverage of the Ru bottom electrode 17.

In addition, the thickness of the Ru bottom electrode 17 should be limited in consideration of the step coverage of a layer covering the capacitor. However, the electric characteristic of the capacitor is deteriorated in case of forming reducing the thickness of the Ru bottom electrode 17 excessively. Therefore, a new process is needed to overcome the above mentioned limitations.

SUMMARY OF THE INVENTION

It is, therefore, an object of the present invention to provide a method fabricating a capacitor in a semiconductor memory device capable of improving step coverage a layer and electric characteristic of a capacitor.

In accordance with an aspect of the present invention, there is provided a method for fabricating a capacitor, comprising: forming a contact hole in an insulating layer formed on a substrate; forming a plug in the contact hole, wherein the plug contains a nitride layer; forming a seed layer on the insulating layer and in the contact hole; forming a sacrificial layer including a trench overlapped with the contact hole; forming a Ru bottom electrode in the trench with electrochemical deposition; removing the sacrificial layer and exposing the Ru bottom electrode, wherein the seed layer not covered with the Ru bottom electrode is exposed; removing the exposed seed layer; forming a dielectric layer on the Ru bottom electrode; and forming a top electrode on the dielectric layer.

In the present invention a Ru layer for a bottom electrode of a capacitor is formed with an electrochemical deposition instead of a metal organic vapor deposition. The Ru layer formed with the electrochemical deposition is hard and resistant to erosion. Also, the Ru layer formed electrochemical deposition has low resistance and is appropriate to use in the capacitor.

In case of using the electrochemical deposition, a layer is selectively formed on an exposed conductive layer, and it is possible to obtain good step coverage. Moreover, an electrolyte used to the electrochemical deposition can be recycled, therefore the electrochemical deposition has an advantage in cost compared to a metal organic chemical vapor deposition (MOCVD).

A good surface step coverage obtained by a chemical vapor deposition can be obtained with the electrochemical deposition. Like a sputtering method, a layer is formed atom by atom with the electrochemical deposition, therefore, it is possible to obtain a dense layer and to prevent generation of crack in the layer.

Cracks are may be formed in a Ru seed layer formed with the MOCVD during a thermal process. The cracks are filled with a Ru layer with use of the electrochemical deposition.

In the present invention, a Ru layer for a bottom electrode of a capacitor is formed on a structure including a trench with the electrochemical deposition, and a chemical-mechanical polishing is applied to the Ru layer in order to obtain uniform height of the bottom electrode in each cell. Therefore, dielectric constant of each cell can be uniform. It is possible to obtain uniform dielectric constant in each cell by forming the Ru layer only in the trench with use of the electrochemical deposition.

BRIEF DESCRIPTION OF THE DRAWINGS

The above and other objects and features of the present invention will become apparent from the following description of the preferred embodiments given in conjunction with the accompanying drawings, in which:

FIG. 2A to FIG. 2I are cross sectional views showing a method for fabricating a capacitor of a semiconductor device in accordance with an embodiment of the present invention.

DETAILED DESCRIPTION OF THE PREFERRED EMBODIMENTS

A method for fabricating a capacitor in accordance with the present invention is described referring to FIG. 2A to FIG. 2I.

Figure 1A:
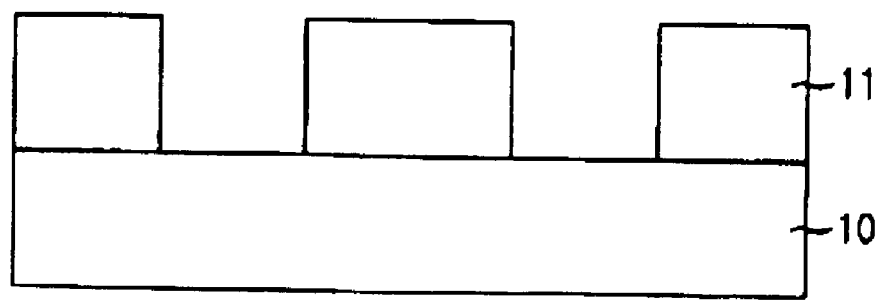
FIG. 1A to FIG. 1F are cross sectional views showing a method for fabricating a capacitor according to a prior art.
Figure 1B:
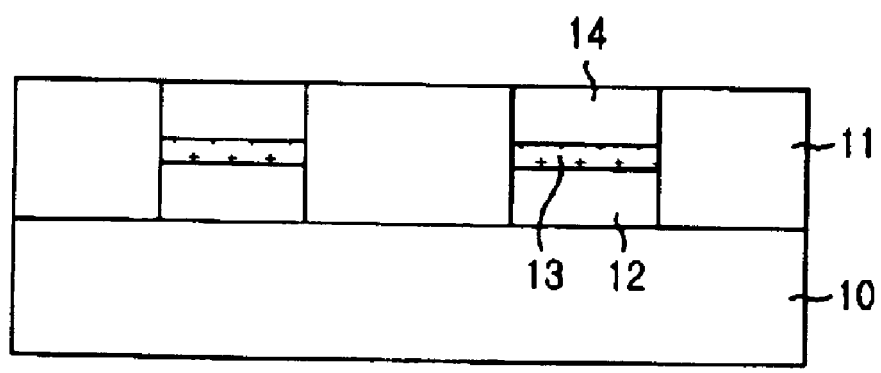
Figure 1C:
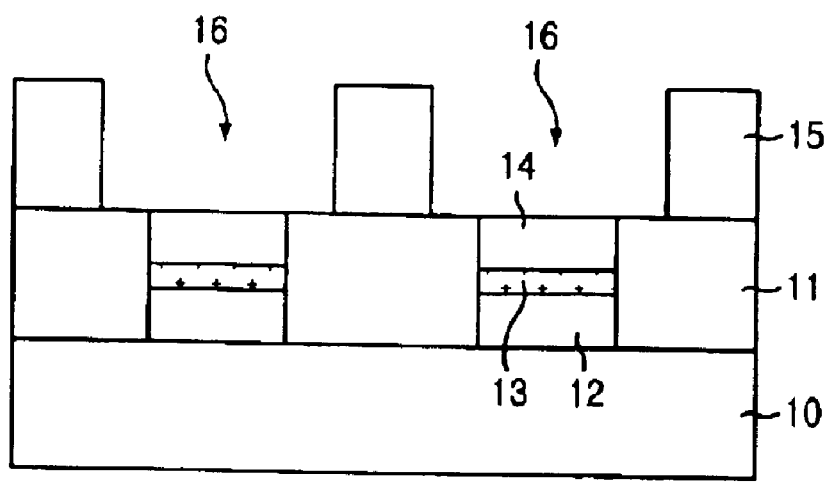
Figure 1D:
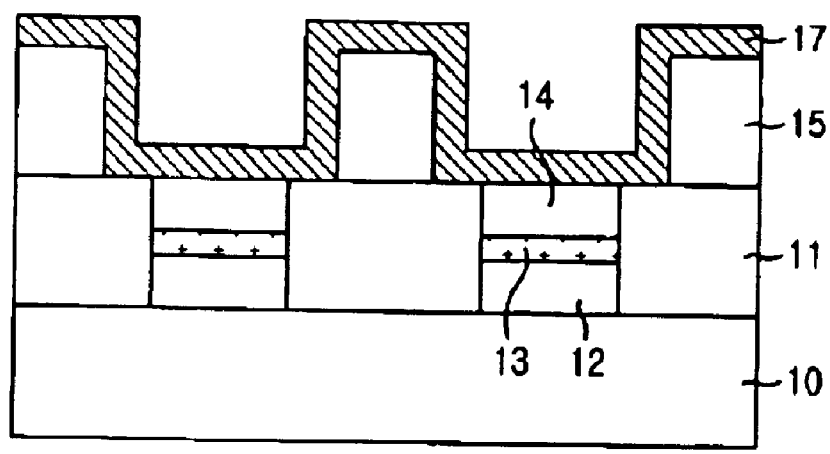
Figure 1E:
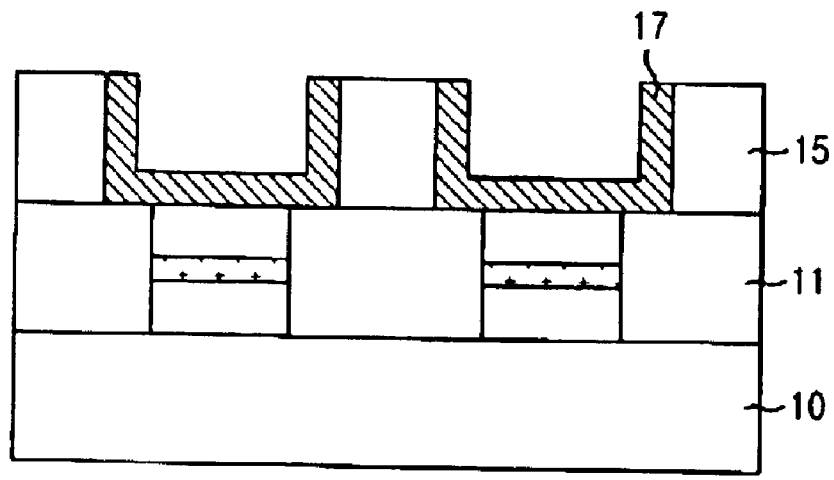
Figure 1F:
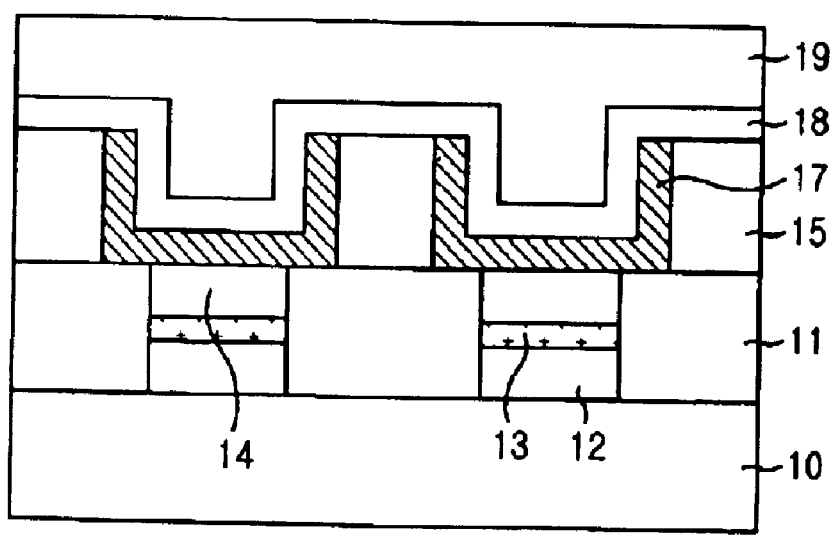
Figure 2A:
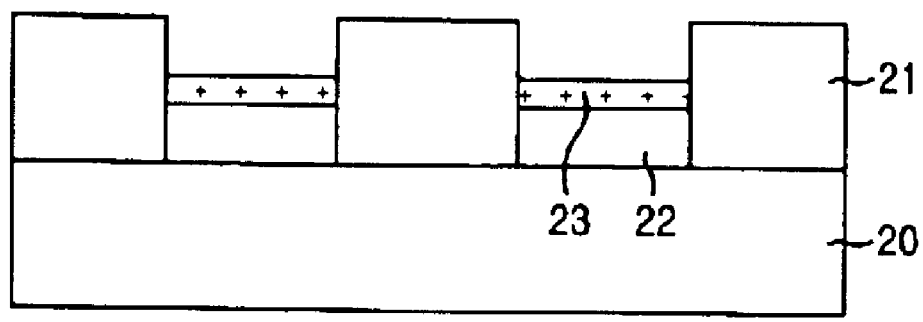

Referring to FIG. 2A, an first interlayer insulating layer 21 is formed over a semiconductor substrate 20 on which transistors (not shown) and bit lines (not shown) are already formed. The first interlayer insulating layer 21 is etched to form a contact hole exposing a portion of the semiconductor substrate 20. At this time, a doped polysilicon or a silicon grown epitaxially is exposed by the contact hole.

Thereafter, a polysilicon layer is formed on the interlayer insulating layer 21 including the contact hole, and an etch back process is applied to form a polysilicon plug 22 in the contact hole. Instead of the polysilicon plug 22, a tungsten plug can be formed.

Then, a titanium layer is formed and a rapid thermal process (RTP) is performed to form a titanium silicide 23 on the polysilicon plug by inducing a reaction between silicon atoms in the polysilicon plug and the titanium layer. The titanium silicide 23 is formed to a thickness ranging from about 50 Å to about 500 Å. Instead of titanium layer, a cobalt layer can be formed. Additionally, a titanium nitride layer is formed to a thickness ranging from about 100 Å to about 300 Å in order to stabilize the formation of the titanium silicide 23. The titanium layer which is not reacted with the polysilicon plug is removed with wet etch using peroxide containing sulfuric acid or ammonium hydroxide.

The titanium silicide layer 23 forms an Ohmic contact between the polysilicon plug 22 and a bottom electrode.

Figure 2B:
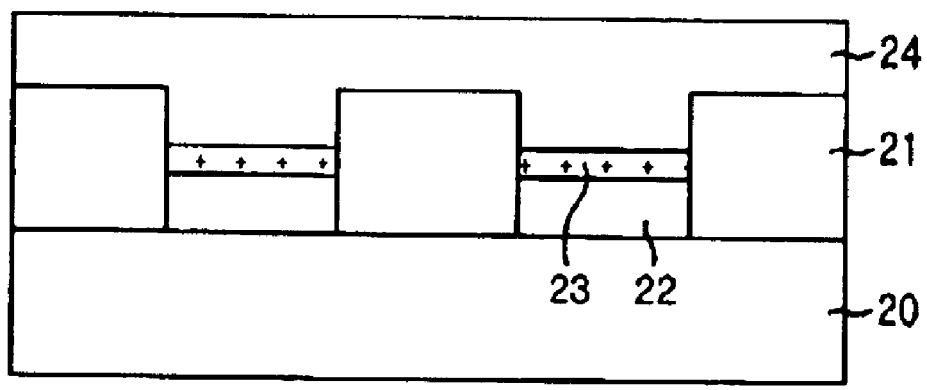

Referring to FIG. 2B, a titanium nitride layer 24 is formed to a thickness ranging from about 500 Å to about 2000 Å. A chemical-mechanical polishing (CMP) is applied to the titanium nitride layer 24 to remove the titanium nitride layer 24 by a thickness ranging from about 200 Å to about 1000 Å. At this time, the first interlayer insulating layer is planarized. Thereafter, an etch back process is performed to leave the titanium nitride layer 24 only in the contact hole.

The CMP can be skipped, at this time the titanium nitride layer 24 is left in the contact hole only with the etch back process.

The titanium nitride layer 24 prevents diffusion of material polysilicon plug 22 and the bottom electrode for a thermal process. The titanium nitride layer 24 also prevents oxygen. A TiAlN layer, a TiSiN layer, a TaSiN layer or a TaAlN layer can be used instead of the titanium nitride layer 24.

Figure 2C:
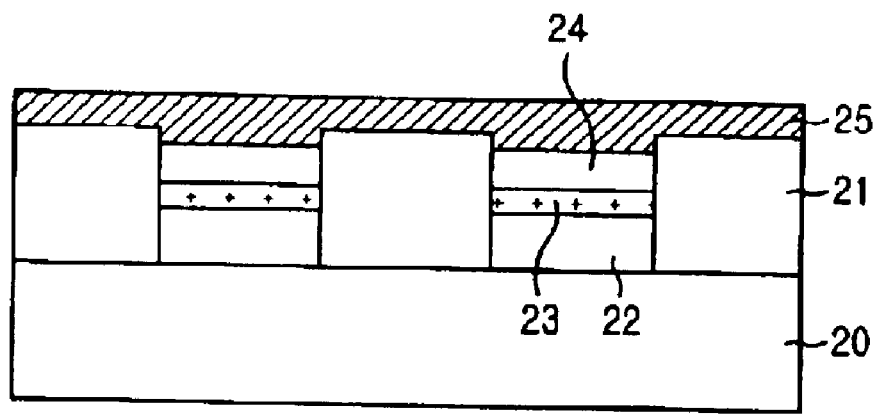

Referring to FIG. 2C, a seed layer 25 for forming a Ru bottom electrode is formed on the first interlayer insulating layer 21 including the contact hole and the titanium nitride layer 24. The seed layer 25 can be formed with Pt, Ru or Ir to a thickness ranging from about 500 Å to about 1000 Å with use of a sputtering or a metal chemical vapor deposition (MOCVD).

An expose of the titanium nitride layer 24 can be prevented by the seed layer 25 even though a misalign is generated during a formation process for a trench which defines a region of a bottom electrode, because the seed layer 25 is also formed in the contact hole. Therefore, a degradation of a capacitor can be prevented. After forming the seed layer 25, an etch back process or a CMP can be performed to control the thickness of the seed layer 25.

Figure 2D:
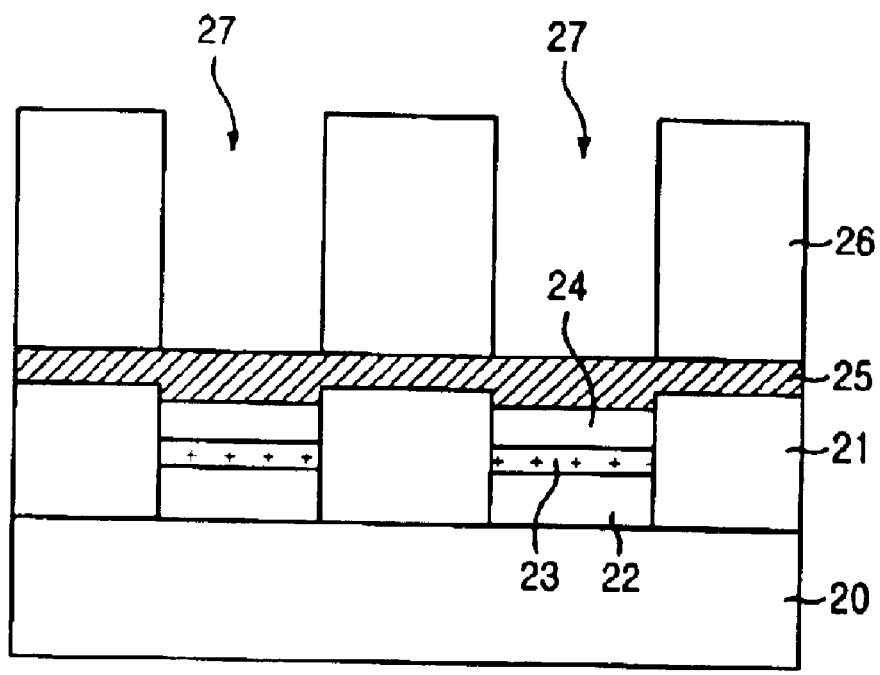

Referring to FIG. 2D, a sacrificial layer 26 is formed on the seed layer 25. The sacrificial layer 26 is formed with undoped silicate glass (USG), phosphor silicate glass (PSG), tetra-ethly-ortho-silicate (TEOS), high temperature oxide (HTO), silicon on glass (SOG) to a thickness ranging from about 5000 Å to about 20000 Å using a chemical vapor deposition or a plasma enhanced chemical vapor deposition.

An adhesion layer can be formed before forming the sacrificial layer 26 in order to increase adhesive strength between the seed layer 25 and the sacrificial layer 26. The adhesion layer is formed with titanium nitride or $Al_2O_3$ to a thickness ranging from about 5000 Å to about 20000 Å using a sputtering or an atomic layer deposition.

A trench 27 is formed in the sacrificial layer 26 through an etch process with use of a hard mask (not shown). In case of forming the adhesion layer, the adhesion layer at the bottom of trench is removed with wet etch using peroxide containing sulfuric acid or ammonium hydroxide. Therefore, only the seed layer 25 is exposed at the bottom of the trench.

Figure 2E:
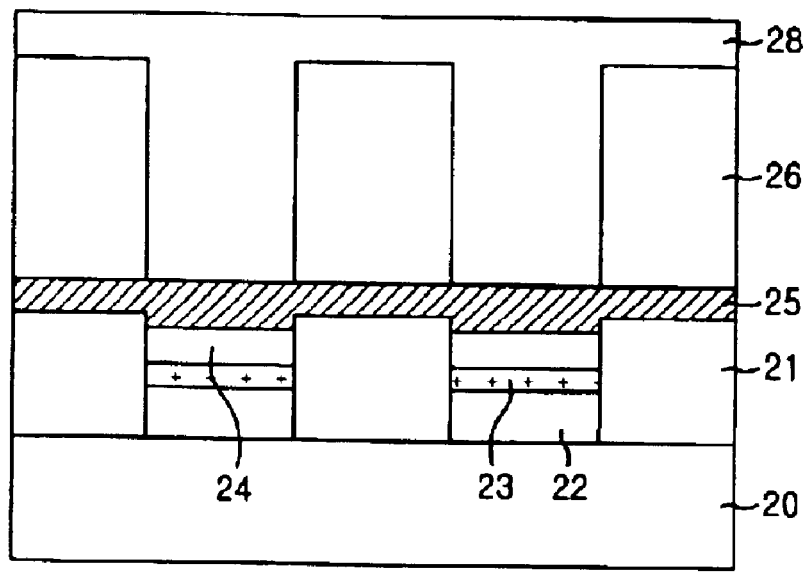

Referring to FIG. 2E, a Ru bottom electrode 28 is formed to a thickness ranging from about 5000 Å to about 25000 Å on the sacrificial layer 26 including the trench 27 with electrochemical deposition. The thickness of the Ru bottom electrode 28 can be controlled by the intensity of current. In the preferred embodiment of the present invention, direct static current, pulsed current or reversed pulsed current is applied with a density of 2 mA/cm$^2$~20 mA/cm$^2$.

Figure 2F:
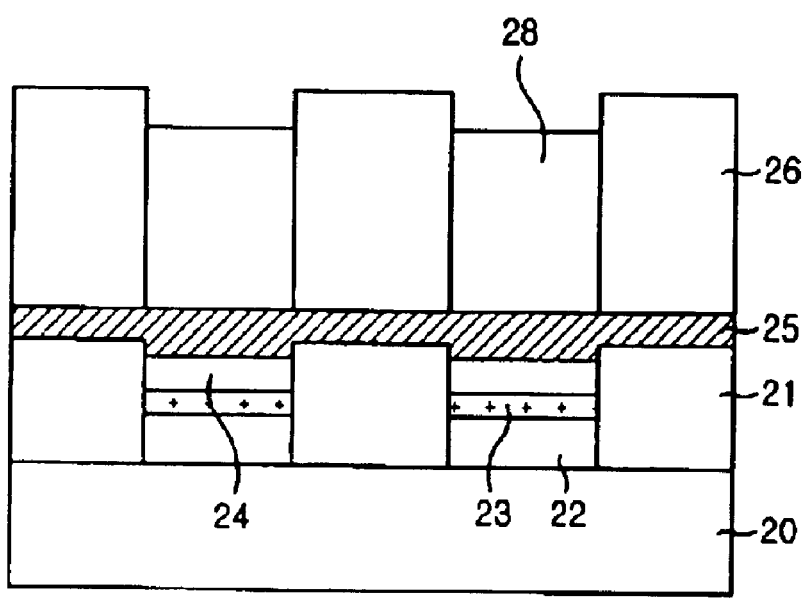

Referring to FIG. 2F, a chemical mechanical polishing is performed until the surface of the sacrificial layer 26 is exposed and the Ru bottom electrode 28 is left only in the trench. At this time, the hard mask used for forming the trench 28 is also removed.

The chemical mechanical polishing can be skipped in case of forming the Ru bottom electrode 28 to a thickness ranging from about 4000 Å to about 20000 Å only in the trench using an electrolyte. In the preferred embodiment of the present invention, ruthenium sulfamate based electrolyte, ruthenium nitrosyl sulfamate based electrolyte or $[Ru_2N(H_2O)_2X_8]^{-3}$ electrolyte is used. The temperature of the electrolyte is maintained to room temperature ~95° C., and the pH of the electrolyte is maintained to 1.0~5.5 or 7.5~13. In case of skipping the chemical mechanical polishing, a wet etch or a dry etch is performed to remove the hard mask.

Figure 2G:
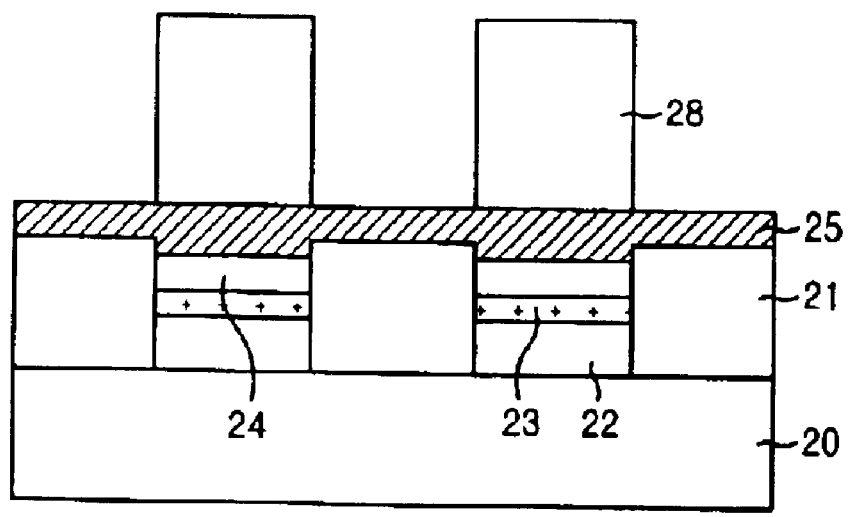

Referring to FIG. 2G, the sacrificial layer is removed with a process using a HF solution for 1 minute~60 minutes. In case of forming the adhesion layer, the adhesion layer with wet etch using peroxide containing sulfuric acid or ammonium hydroxide for 30 seconds~10 minutes.

A thermal process is performed in an ambient of nitrogen or argon at a temperature of 450° C.~700° C. for 30 seconds~30 minutes in order to densify the Ru bottom electrode 28.

Figure 2H:
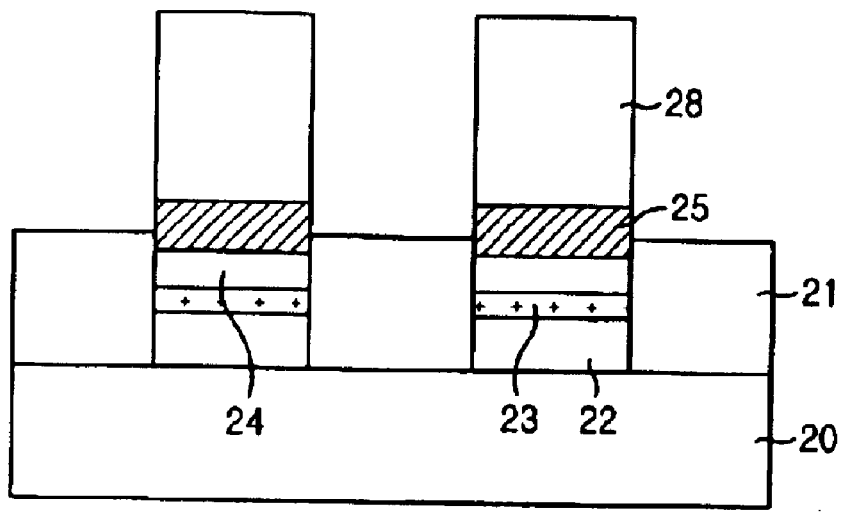
Figure 21:
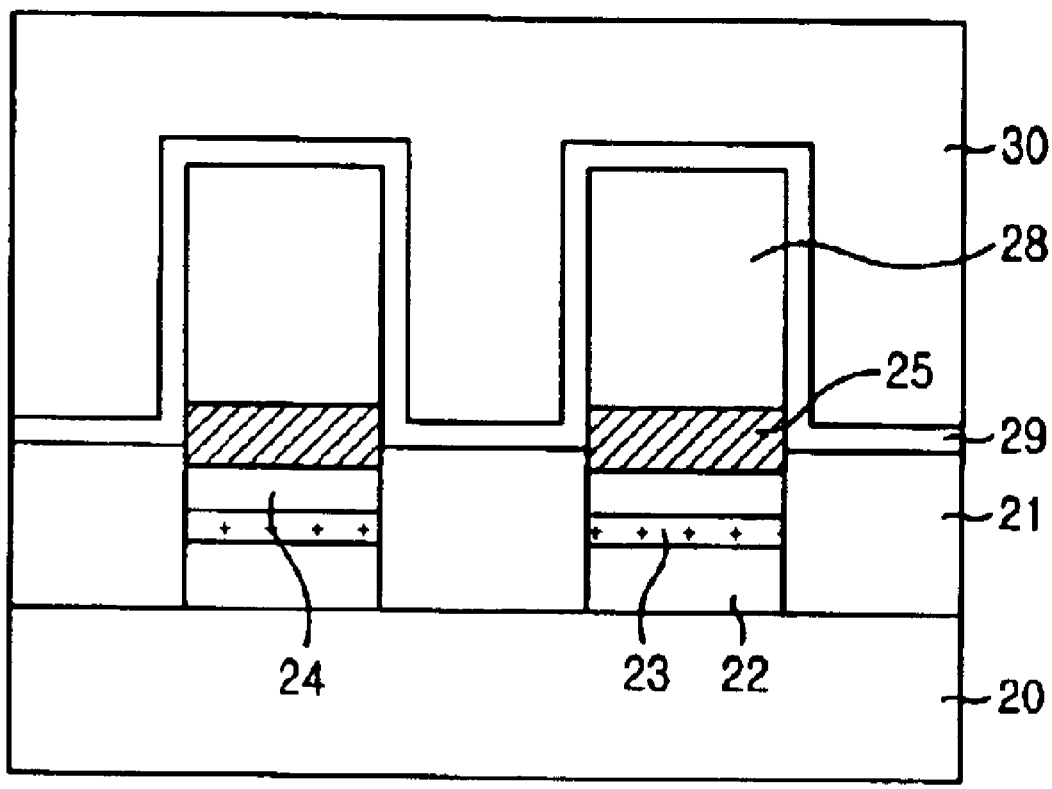

Referring to FIG. 2H, the seed layer 25 not covered with the Ru bottom electrode 28 is removed with a dry etch in order to isolate neighboring Ru bottom electrodes 28. After the dry etch, a wet etch process is performed for 1 minutes~10 minutes for cleaning the surface of the Ru bottom electrode 28.

Referring to FIG. 2I, a dielectric layer 29 and a top electrode 30 are formed to form a capacitor. The high dielectric layer 29 is formed to a thickness ranging from about 80 Å to about 300 Å with a high dielectric material such as $Al_2O_3$, $Ta_2O_5$, $Ta_2O_5$—$TiO_2$, $SrTiO_3$ or $(Ba,Sr)TiO_3$ using a metal organic chemical vapor deposition or an atomic layer deposition. After forming the dielectric layer a thermal process for 10 minutes~30 minutes or a plasma treatment for 30 seconds~10 minutes in an ambient of $N_2O$ or $N_2/O_2$, at temperature of 400° C.~800° C.

The top electrode 30 is formed with two layers in order to reduce cost. A first top electrode is formed to a thickness ranging from about 100 Å to about 300 Å with Ru, Pt or Ir using a metal organic chemical vapor deposition or an atomic layer deposition. A second top electrode is formed on the first top electrode to a thickness ranging from about 500 Å to about 1000 Å with Ru, Pt or Ir using a sputtering. That is, the first top electrode is formed with the metal organic chemical vapor deposition or the atomic layer deposition which can provide good step coverage but requires high production cost, and the second top electrode is formed with the sputtering which requires low production cost.

A highly integrated device comprising a metal bottom electrode of capacitor can be formed more easily and good step coverage can be obtained by adopting the electrochemical vapor deposition. The characteristic of the Ru bottom electrode can be improved by the electrochemical vapor deposition compared to the Ru bottom electrode formed by the metal organic chemical vapor deposition. Therefore, the characteristics of capacitor can be improved. The reliability of the devices are also improved even though misalign is generated between the bottom electrode and the contact hole, because the diffusion barrier in the contact hole is not exposed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor, comprising:

forming a contact hole in an insulating layer formed on a substrate;

forming a plug in the contact hole, wherein the plug contains a nitride layer, which partially fills the contact hole, formed by performing an etch back process;

forming a seed layer on the insulating layer and the nitride layer in the contact hole;

forming a sacrificial layer including a trench overlapped with the contact hole;

forming a Ru bottom electrode in the trench with electrochemical deposition by using ruthenium sulfamate based electrolyte, ruthenium nitrosyl sulfamate based electrolyte or $[Ru_2N(H_2O)_2X_8]^{-3}$ electrolyte;

removing the sacrificial layer and exposing the Ru bottom electrode, wherein the seed layer not covered with the Ru bottom electrode is exposed;

removing the exposed seed layer;

forming a dielectric layer on the Ru bottom electrode; and forming a top electrode on the dielectric layer.

2. The method as recited in claim 1, wherein the step of forming the Ru bottom electrode includes:

forming the Ru bottom electrode on the sacrificial layer; and performing chemical mechanical polishing to leave the Ru bottom electrode only in the trench.

3. The method as recited in claim 1, wherein the temperature of the electrolyte is maintained at room temperature to 95° C.

4. The method as recited in claim 1, wherein the pH of the electrolyte is maintained at 1.0 to 5.5 or 7.5 to 13.

5. The method as recited in claim 1, wherein current is applied with a density of 2 mA/cm$^2$~20 mA/cm$^2$ to form the Ru bottom electrode.

6. The method as recited in claim 1, wherein the seed layer is formed with a sputtering or a metal organic chemical deposition.

7. The method as recited in claim 1, further comprising the step of controlling a thickness of the seed layer with a chemical mechanical polishing or etch back, after forming the seed layer.

8. The method as recited in claim 1, further comprising the step of forming an adhesion layer on the seed layer.

9. The method as recited in claim 8, wherein the adhesion layer is formed with TiN or $Al_2O_3$.

10. The method as recited in claim 1, further comprising the step of applying a thermal process to the Ru bottom electrode.

11. The method as recited in claim 10, wherein the thermal process is performed in an ambient of nitrogen or argon at a temperature of 450° C. to 700° C.

* * * * *